(12) United States Patent
Chen

(10) Patent No.: US 11,018,314 B2
(45) Date of Patent: May 25, 2021

(54) ORGANIC ELECTROLUMINESCENT DIODE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Lei Chen, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/617,082

(22) PCT Filed: Apr. 9, 2019

(86) PCT No.: PCT/CN2019/081937
§ 371 (c)(1),
(2) Date: Nov. 26, 2019

(87) PCT Pub. No.: WO2019/196839
PCT Pub. Date: Oct. 17, 2019

(65) Prior Publication Data
US 2020/0168831 A1 May 28, 2020

(30) Foreign Application Priority Data
Apr. 11, 2018 (CN) .......................... 201810319526.4

(51) Int. Cl.
*H01L 51/50* (2006.01)
*H01L 51/00* (2006.01)

(52) U.S. Cl.
CPC ...... *H01L 51/5096* (2013.01); *H01L 51/0059* (2013.01); *H01L 51/0072* (2013.01); *H01L 51/0085* (2013.01); *H01L 51/001* (2013.01)

(58) Field of Classification Search
CPC combination set(s) only.
See application file for complete search history.

(56) References Cited

U.S. PATENT DOCUMENTS

| | | | | |
|---|---|---|---|---|
| 2015/0060775 A1* | 3/2015 | Liang | ............... | H01L 51/002 257/40 |
| 2017/0010734 A1* | 1/2017 | Liu | ............... | H01L 27/323 |

FOREIGN PATENT DOCUMENTS

| | | | |
|---|---|---|---|
| CN | 104934543 | * | 9/2015 |
| CN | 104934543 A | | 9/2015 |
| CN | 108448003 A | | 8/2018 |

OTHER PUBLICATIONS

International Search Report of PCT/CN2019/081937 in Chinese, dated Jul. 16, 2019, with English translation.

* cited by examiner

*Primary Examiner* — Ratisha Mehta
(74) *Attorney, Agent, or Firm* — Collard & Roe, P.C.

(57) ABSTRACT

An organic electroluminescent diode, a display panel, a display device and a manufacturing method of an organic electroluminescent diode are provided. The organic electroluminescent diode includes a first electrode, a first electron blocking layer, a light-emitting layer and a second electrode which are stacked arranged in sequence, a surface of the first electron blocking layer in contact with the light-emitting layer is doped with a hole-type non-metallic material. In the embodiment of the present disclosure, by doping the hole-type non-metallic material in the first electron blocking layer, the density of the holes at the recombination interface is increased, the utilization rate of the holes is improved, and the loss of holes in the transmission process is avoided, which ensures that the holes are timely recombined with the transmitted electrons, and avoids the accumulation of too many electrons at the interface between the first electron blocking layer and the light-emitting layer.

16 Claims, 3 Drawing Sheets

ORGANIC ELECTROLUMINESCENT DIODE AND MANUFACTURING METHOD THEREOF, DISPLAY PANEL AND DISPLAY DEVICE

CROSS REFERENCE TO RELATED APPLICATIONS

This application is the National Stage of PCT/CN2019/081937 filed on Apr. 9, 2019, which claims priority under 35 U.S.C. § 119 of Chinese Application No. 201810319526.4 filed on Apr. 11, 2018, the disclosure of which is incorporated by reference.

TECHNICAL FIELD

The present disclosure relates to a display technical field, in particular to an organic electroluminescent diode, a display panel, a display device and a manufacturing method of an organic electroluminescent diode.

BACKGROUND

An organic electroluminescent diode (for example, organic light-emitting light, OLED) or an organic electroluminescent device has characteristics of high brightness, wide range of material selection, low driving voltage, fully cured active illumination and so on. The organic electroluminescent diode or the organic electroluminescent device has a wide range of applications in the display field.

The luminescence principle of the OLED is: under an action of an applied electric field, electrons are injected from a cathode into the lowest unoccupied molecular orbit (LUMO) of an organic layer, and holes are injected from an anode into the highest occupied orbit (HOMO) of the organic layer. For example, a transport path of the holes is the anode→the hole transport layer→the light-emitting layer, and a transport path of the electrons is the cathode-→the electron transport layer→the light-emitting layer. In a case that the holes and the electrons reach the light-emitting layer respectively, the holes meet the electrons in the light-emitting layer, and then the holes and the electrons are recombined to form excitons. Under the action of the electric field, the excitons migrate and transfer the energy to the light-emitting material, and excite the electrons to transition from a ground state to an excited state. The energy in the excited state generates photons by radiation inactivation to release light energy.

SUMMARY

At least one embodiment of the present disclosure provides an organic electroluminescent diode, a display panel, a display device and a manufacturing method of an organic electroluminescent diode, to prolong the lifetime of the organic electroluminescent diode.

At least one embodiment of the present disclosure provides an organic electroluminescent diode, and the organic electroluminescent diode comprises: a first electrode, a first electron blocking layer, a light-emitting layer and a second electrode which are stacked arranged in sequence; a surface of the first electron blocking layer in contact with the light-emitting layer is doped with a hole-type non-metallic material.

For example, in the organic electroluminescent diode provided by at least one embodiment of the present disclosure, the hole-type non-metallic material comprises at least one selected from a group consisting of 4,4',4"-tris(N-3-methylphenyl-N-phenylamino)-triphenylamine (m-MTA-DATA) and tris(2-phenylpyridine) Iridium (Ir(ppy)$_3$).

For example, in the organic electroluminescent diode provided by at least one embodiment of the present disclosure, a mass percentage of the hole-type non-metallic material in the first electron blocking layer ranges from about 0.5% to 10%.

For example, in the organic electroluminescent diode provided by at least one embodiment of the present disclosure, the mass percentage of the hole-type non-metallic material in the first electron blocking layer ranges from about 1% to 5%.

For example, in the organic electroluminescent diode provided by at least one embodiment of the present disclosure, a host material of the first electron blocking layer comprises at least one selected from a group consisting of N,N'-bis(3-methylphenyl)-NN'-diphenyl-4,4'-biphenyl-diamine, 4,4',4"-tris(carbazol-9-yl)triphenylamine and N,N'-(1-naphthyl)-N,N'-diphenyl-4,4'-biphenyldiamine.

For example, in the organic electroluminescent diode provided by at least one embodiment of the present disclosure, the hole-type non-metallic material is uniformly doped in the first electron blocking layer.

For example, in the organic electroluminescent diode provided by at least one embodiment of the present disclosure, the hole-type non-metallic material is doped in a portion of the first electron blocking layer, and the portion of the first electron blocking layer doped with the hole-type non-metallic material is on a side of the first electron blocking layer close to the light-emitting layer.

For example, the organic electroluminescent diode provided by at least one embodiment of the present disclosure further comprises a hole transport layer; the first electron blocking layer is arranged between the light-emitting layer and the hole transport layer.

For example, the organic electroluminescent diode provided by at least one embodiment of the present disclosure further comprises: a hole injection layer arranged between the first electrode and the hole transport layer, an electron transport layer arranged between the light-emitting layer and the second electrode; and an electron injection layer arranged between the electron transport layer and the second electrode.

For example, the organic electroluminescent diode provided by at least one embodiment of the present disclosure further comprises: a second electron blocking layer arranged between the first electron blocking layer and the hole transport layer.

For example, in the organic electroluminescent diode provided by at least one embodiment of the present disclosure, a material of the second electron blocking layer is same as a host material of the first electron blocking layer.

At least one embodiment of the present disclosure further provides a display panel, and the display panel comprises any one of the organic electroluminescent diodes mentioned above.

At least one embodiment of the present disclosure further provides a display device, and the display device comprises any one of the display panels mentioned above.

At least one embodiment of the present disclosure further provides a manufacturing method of an organic electroluminescent diode, and the method comprises: forming a first electrode, a first electron blocking layer, a light-emitting layer and a second electrode, and a surface of the first electron blocking layer in contact with the light-emitting layer is doped with a hole-type non-metallic material.

For example, in the manufacturing method provided by at least one embodiment of the present disclosure, the hole-type non-metallic material comprises at least one selected from a group consisting of 4,4',4"-tris(N-3-methylphenyl-N-phenylamino)-triphenylamine (m-MTADATA) and tris(2-phenylpyridine) Iridium (Ir(ppy)$_3$).

For example, in the manufacturing method provided by at least one embodiment of the present disclosure, the hole-type non-metallic material is uniformly doped in the first electron blocking layer.

For example, in the manufacturing method provided by at least one embodiment of the present disclosure, the hole-type non-metallic material is doped in a portion of the first electron blocking layer, and the portion of the first electron blocking layer doped with the hole-type non-metallic material is on a side of the first electron blocking layer close to the light-emitting layer.

For example, the manufacturing method provided by at least one embodiment of the present disclosure further comprises: forming a hole transport layer between the first electrode and the first electron blocking layer; forming a hole injection layer between the first electrode and the hole transport layer; forming an electron transport layer between the light-emitting layer and the second electrode; and forming an electron injection layer between the electron transport layer and the second electrode.

For example, the manufacturing method provided by at least one embodiment of the present disclosure further comprises: forming a second electron blocking layer between the first electron blocking layer and the hole transport layer.

For example, in the manufacturing method provided by at least one embodiment of the present disclosure, all of the first electron blocking layer, the second electron blocking layer and the light-emitting layer are formed by an evaporation method.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
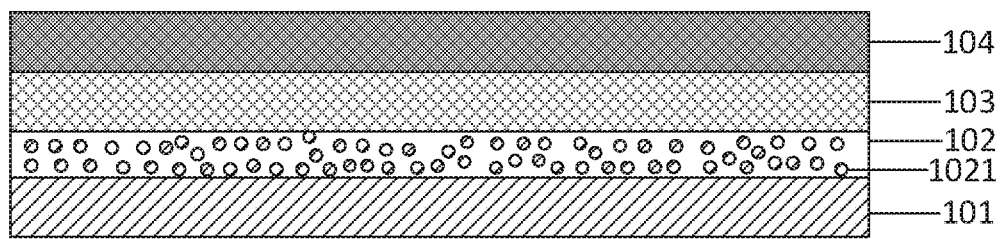
FIG. 1 is a schematic sectional structure diagram of an organic light-emitting diode provided by an embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

An active matrix organic light-emitting diode (AMO-LED) has attracted more and more attentions due to its advantages of being thin and light, and capable of preparing a flexible and transparent display device. No matter a small-sized display panel, a medium-sized display panel or a large-sized display panel, more and more OLED products are on the market, and customers have higher and higher requirements for the resolution of the OLED display panels.

While the resolution of the display panel is increased, the aperture ratio of the display panel is continuously decreased. If the brightness of the display panel is also required to be increased, it has a greater test and requirement for the lifetime of the display panel. After a long-term use of the display panel, the lifetime of the display panel is shortened. After the display panel is used for a long time, the phenomenon of white balance color drift also appears. When the white screen is turned on, the color appears red, green or pink.

The shortening of the lifetime of the OLED display panel depends on the stability of the material of each of the layers of the OLED display panel on one hand and the design of the device structure on the other hand. For the material of each of the layers of the OLED display panel itself, the stability of the material itself is able to be increased by introducing rigid groups into material molecules. For the device structure design, carrier balance is achieved by matching the function layers of the display device. For example, in the OLED device, holes are injected from an anode, and electrons are injected from a cathode; the holes are transmitted by a hole transport layer, and the electrons are transmitted by an electrode transport layer, and finally the electrons and the holes are recombined to form excitons and emit light. If a composite region of the electrons and the holes is at an interface between the electron blocking layer (EBL) and the light-emitting layer (EML), it is more conducive to the improvement of the composite efficiency and the reduction of applied voltage, so the composite region of the OLED device is generally designed at the interface of the EBL and the EML. However, the recombination of the electrons and the holes at the interface of the EBL and the EML shortens the lifetime of the device. Because the material of the electron blocking layer is generally an electron-rich material, which contains aniline. The recombination of the electrons and the holes at the interface of the EBL and the EML means that a large number of electrons are transmitted to the interface. If the transmitted electrons cannot be completely and timely recombined with the holes, then excessive electrons have the repulsive force with the rich electrons in the material of the EBL, the repulsive force causes the distortion of the benzene ring S bond on aniline. The result of the distortion of the δ bond caused by the external force is the fracture of the bond, which leads to the shortening of the lifetime of the OLED device.

The inventors of the present disclosure found that doping hole-type non-metallic material in the electron blocking layer can effectively block the electrons and greatly increase the LUMO energy level of the electron blocking layer, which increases the barrier between the electron blocking layer and the light-emitting layer, therefore, the electrons are limited in the light-emitting layer as many as possible to recombine with the holes, such that the probability of recombination to generate the excitons are both increased in the light-emitting layer.

For example, FIG. 1 is a schematic sectional structure diagram of an organic light-emitting diode provided by an embodiment of the present disclosure. As illustrated in FIG. 1, the organic electroluminescent diode 100 comprises a first electrode 101, a first electron blocking layer 102, a light-emitting layer 103 and a second electrode 104 which are stacked arranged in sequence, a surface of the first electron blocking layer 102 in contact with the light-emitting layer 103 is doped with a hole-type non-metallic material 1021.

For example, the hole-type non-metallic material 1021 comprises at least one selected from a group consisting of 4,4',4"-tris(N-3-methylphenyl-N-phenylamino)-triphenylamine (m-MTADATA) and tris(2-phenylpyridine) Iridium (Ir(ppy)$_3$). Those skilled in the art may also select other appropriate doping materials according to actual requirements.

For example, a mass percentage of the hole-type non-metallic material 1021 in the first electron blocking layer 102 ranges from about 0.5% to 10%. For example, 0.5%, 1%, 2%, 3%, 4%, 5%, 6%, 7%, 8%, 9% or 10% and so on.

For example, the mass percentage of the hole-type non-metallic material 1021 in the first electron blocking layer 102 ranges from about 1% to 5%. For example, 1.5%, 2.5%, 3.5% or 4.5% and so on.

For example, a host material of the first electron blocking layer 102 comprises at least one selected from a group consisting of N,N'-bis(3-methylphenyl)-NN'-diphenyl-4,4'-biphenyldiamine, 4,4',4"-tris(carbazol-9-yl)triphenylamine and N,N'-(1-naphthyl)-N,N'-diphenyl-4,4'-biphenyldiamine.

For example, as illustrated in FIG. 1, the hole-type non-metallic material 1021 is uniformly doped in the first electron blocking layer 102, so that each portion of the first electron blocking layer 102 has a same effect on blocking the electrons, and the electrons entering the first electron blocking layer 102 are evenly distributed in the first electron blocking layer 102.

Figure 2:
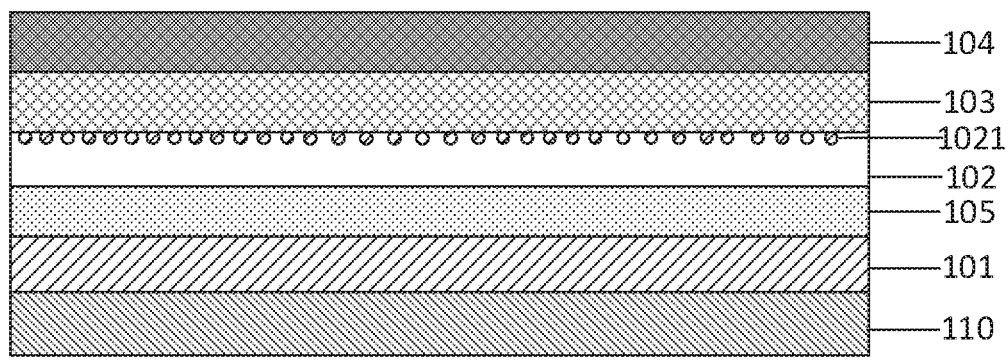
FIG. 2 is a schematic sectional structure diagram of an organic light-emitting diode provided by another embodiment of the present disclosure.

For example, FIG. 2 is a schematic sectional structure diagram of an organic light-emitting diode provided by another embodiment of the present disclosure. As illustrated in FIG. 2, the hole-type non-metallic material 1021 is doped in a portion of the first electron blocking layer 102, and hole-type the portion doped with the hole-type non-metallic material 1021 is on a side of the first electron blocking layer 102 close to the light-emitting layer. In this way, the electrons entering the first electron blocking layer 102 are more distributed on the side of the first electron blocking layer 102 close to the light-emitting layer 103, which is more conducive to the recombination of the electrons and the holes in the light-emitting layer 103.

For example, the material of the light-emitting layer 103 is a light-emitting material, or a mixture formed by doping the light-emitting material in the host material.

For example, the light-emitting material comprises at least one selected from a group consisting of 4-(dinitylmethyl)-2-butyl-6-(1,1,7,7-tetramethyljuroxidine-9-vinyl)-4H-pyran (DCJTB), 8-hydroxyquinoline aluminum (Alq$_3$), bis (4,6-difluorophenylpyridine-N, C2) pyridinecarboxamide iridium (Firpic), bis(2-methyl-diphenyl[f,h]quinoxaline) (acetylacetonate) iridium (Ir (MDQ)$_2$ (acac)) and tris(2-phenylpyridine) Iridium (Ir(ppy)$_3$).

For example, the host material of the light-emitting layer comprises at least one selected from a group consisting of N, N'-bis (3-methylphenyl)-N, N'-diphenyl-4,4'-biphenyl-diamine (TPD), 4,4',4"-tris(carbazol-9-yl)triphenylamine (TCTA), N,N'-(1-naphthyl)-N,N'-diphenyl-4,4'-biphenyl-diamine (NPB), 2-(4-biphenyl)-5-(4-tert-butyl)phenyl-1,3,4-oxadiazole (PBD), 8-hydroxyquinoline aluminum (Alq$_3$), 4,7-diphenyl-1,10-phenanthroline (Bphen), 1,2,4-triazole derivatives (e.g., TAZ) and N-arylbenzimidazole (TPBI). The mass percentage of the light-emitting material in the mixture formed by doping the light-emitting material into the host material is from 10% to 20%.

For example, a thickness of the light-emitting layer 103 is from 2 nm to 50 nm, for example, the thickness of the light-emitting layer 103 is 30 nm.

For example, a material of the first electrode 101 is a transparent conductive material, the transparent conductive material comprises indium tin oxide (ITO), indium zinc oxide (IZO), indium gallium oxide (IGO), gallium zinc oxide (GZO) zinc oxide (ZnO), indium oxide (In$_2$O$_3$), zinc aluminum oxide (AZO) or carbon nanotube and so on.

For example, the material of the first electrode 101 is a metal conductive material, the metal conductive material comprises a single metal, such as copper (Cu), chromium (Cr), molybdenum (Mo), gold (Au), silver (Ag) and platinum (Pt), or an alloy material formed by the above metals, such as copper chromium alloy (CuCr) or chromium molybdenum alloy (CrMo), and so on.

For example, a thickness of the first electrode 101 is from 40 nm to 120 nm, for example: 40 nm, 50 nm, 60 nm, 70 nm, 80 nm, 90 nm, 100 nm, 110 nm or 120 nm.

For example, the material of the second electrode 104 comprises a single metal, such as silver, magnesium, aluminum, or lithium; or the material of the second electrode 104 is magnesium aluminum alloy (MgAl) or lithium aluminum alloy (LiAl), and so on.

For example, a thickness of the second electrode is from 3 nm to 30 nm, for example: 5 nm, 10 nm, 15 nm, 20 nm, 25 nm or 30 nm.

For example, the first electrode is an anode, the second electrode is a cathode; or the first electrode is a cathode, and the second electrode is an anode.

The first electrode 101 is arranged on a base substrate 110, the base substrate 110 is a glass substrate, a quartz substrate or a plastic substrate and so on.

It should be noted that, the material and the structure of the first electrode and the second electrode are only one example in the embodiment of the present disclosure. The first electrode and the second electrode may also be made of other materials. According to the different materials of the first electrode and the second electrode, the device can be divided into a single-sided light-emitting device and a double-sided light-emitting device. In a case that the material of one of the anode and cathode is transparent or semi-transparent, the device is a single-sided light-emitting type device. In a case that both the material of the anode and the material of the cathode are transparent and/or semi-transparent, the device is a double-sided light-emitting type device.

For a single-sided light-emitting type OLED array substrate, according to the different materials of the anode and the cathode, the OLED array substrate can be divided into two types: a top light-emitting type OLED array substrate and a bottom light-emitting type OLED array substrate. In a case that the anode is arranged close to the base substrate, and the cathode is arranged far away from the base substrate, and the material of the anode is transparent conductive material, and the material of the cathode is opaque conductive material, because light passes through the anode and exits from the base substrate, so it is called as the bottom light-emitting type OLED array substrate. In a case that the material of the anode is opaque conductive material and the material of the cathode is transparent or semi-transparent conductive material, the light emitted from the cathode far away from the base substrate, so it is called as the top light-emitting type OLED array substrate. The relative positions of the anode and the cathode can also be exchanged, which are omitted herein.

For the double-sided light-emitting type OLED array substrate, in a case that the anode is arranged close to the base substrate, and the cathode is arranged far away from the base substrate, and both the material of the anode and the material of the cathode are transparent conductive material and/or semi-transparent conductive material; on one hand, light is emitted through the anode and then emitted from the base substrate, and on the other hand, light is emitted from the cathode away from the base substrate, so it is called as the double-sided light-emitting type. Herein, the anode may also be arranged away from the base substrate, and the cathode is arranged close to the base substrate.

According to requirements, the material of the first electrode and the material of the second electrode can be selected to be suitable for the top light-emitting type OLED array substrate, the bottom light-emitting type OLED array substrate and the double-sided light-emitting type OLED array substrate respectively. The embodiment of the present disclosure does not limit the selection of the material of the first electrode and the material of the second electrode.

Figure 3:
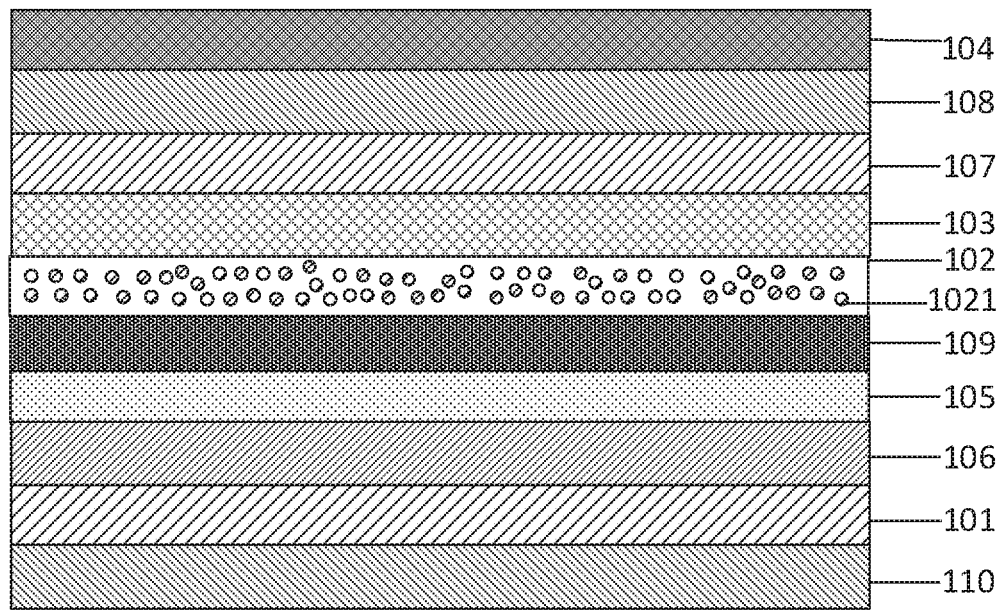
FIG. 3 is a schematic sectional structure diagram of an organic light-emitting diode provided by still another embodiment of the present disclosure.

For example, FIG. 3 is a schematic sectional structure diagram of an organic light-emitting diode provided by still another embodiment of the present disclosure. As illustrated in FIG. 3, the organic light-emitting diode 100 further comprises a hole transport layer 105, and the first electron blocking layer 102 is arranged between the light-emitting layer 103 and the hole transport layer 105.

For example, the material of the hole transport layer 105 comprises at least one selected from a group consisting of N,N'-bis(3-methylphenyl)-N,N'-diphenyl-4,4'-biphenyl-diamine (TPD), 4,4',4''-tris(carbazol-9-yl)triphenylamine (TCTA) and N,N'-(1-naphthyl)-N,N'-diphenyl-4,4'-biphenyldiamine (NPB).

For example, a thickness of the hole transport layer 105 is from 1000 nm to 1300 nm, for example 1200 nm.

As illustrated in FIG. 3, the organic light-emitting diode 100 further comprises: a hole injection layer 106 arranged between the first electrode 101 and the hole transport layer 105; an electron transport layer 107 arranged between the light-emitting layer 103 and the second electrode 104; and an electron injection layer 108 arranged between the electron transport layer 107 and the second electrode 104.

For example, a material of the hole injection layer 106 is molybdenum oxide ($MoO_3$), tungsten trioxide ($WO_3$) or vanadium pentoxide ($V_2O_5$).

For example, the thickness of the hole injection layer 106 is from 5 nm to 30 nm, for example, 20 nm.

For example, a material of the electron transport layer 107 comprises at least one selected from a group consisting of 2-(4-biphenyl)-5-(4-tert-butyl)phenyl-1,3,4-oxadiazole (PBD), 8-hydroxyquinoline aluminum ($Alq_3$), 4,7-diphenyl-1,10-phenanthroline (Bphen), 1,2,4-triazole derivatives (e.g., TAZ) and N-arylbenzimidazole (TPBI).

For example, the thickness of the electron transport layer 107 is from 20 nm to 35 nm, for example, 30 nm.

For example, the material of the electron injection layer 108 comprises at least one selected from a group consisting of lithium carbonate ($Li_2CO_3$), lithium chloride (LiCl) and lithium fluoride (LiF).

For example, the thickness of the electron injection layer 108 is from 1 nm to 3 nm, for example, 2 nm.

As illustrated in FIG. 3, the organic light-emitting diode 100 further comprises a second electron blocking layer 109 arranged between the first electron blocking layer 102 and the hole transport layer 105.

For example, the material of the second electron blocking layer 109 is the same as the host material of the first electron blocking layer 102. The second electron blocking layer 109 may not be doped.

For example, the first electron blocking layer 102 and the second electron blocking layer 109 can control the flow direction of electrons in the OLED (blocking the reverse leakage current) to increase the luminous efficiency.

The embodiment of the present disclosure increases the density of the holes at the recombination interface, increases the utilization rate of the holes and avoids the loss of the holes in the transmission process by doping the hole-type non-metallic material 1021 in the first electron blocking layer 102, which ensures that the holes are timely recombined with the transmitted electrons, and avoids the accumulation of too many electrons at the interface between the first electron blocking layer and the light-emitting layer, so as to reduce the damage to the first electron blocking layer, and finally the lifetime of the device is prolonged.

Figure 4:
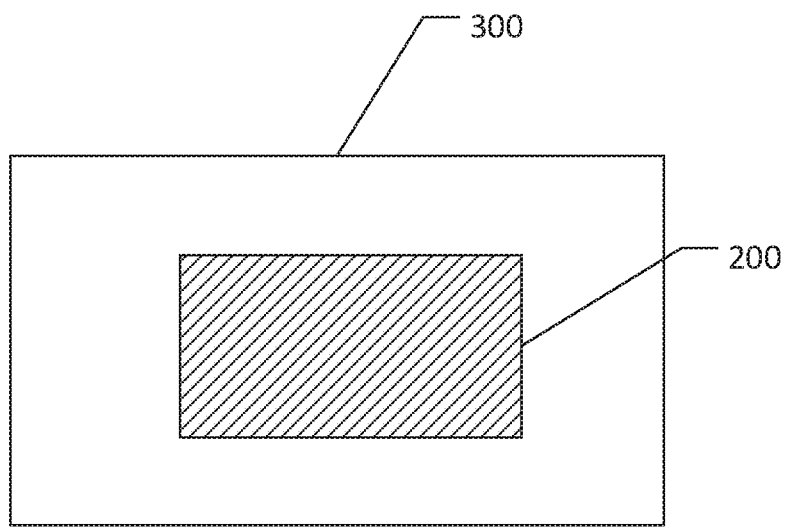
FIG. 4 is a block diagram of a display panel provided by an embodiment of the present disclosure.

The embodiment of the present disclosure further provides a display panel, for example, FIG. 4 is a block diagram of a display panel provided by an embodiment of the present disclosure, and the display panel 200 comprises any one of the organic light-emitting diodes 100 mentioned above. Compared with a liquid crystal display, the OLED (organic light-emitting diode) display panel has the advantages of self-illumination, fast response and wide viewing angle. The OLED display panel can be applied to a flexible display, a transparent display, a 3D display, and so on.

Figure 5:
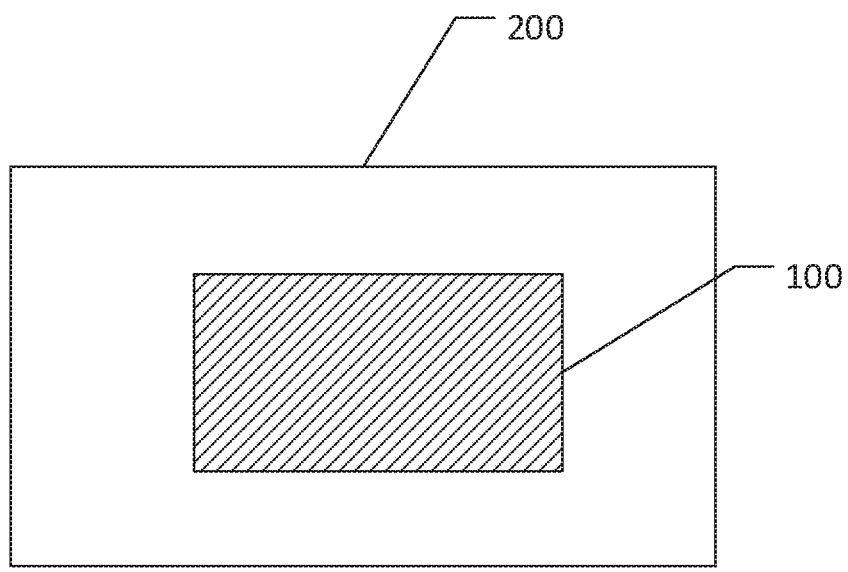
FIG. 5 is a block diagram of a display device provided by an embodiment of the present disclosure.

The embodiment of the present disclosure further provides a display device, for example, FIG. 5 is a block diagram of a display device provided by an embodiment of the present disclosure. The display device 300 comprises any one of the display panels 200 mentioned above, and the display device may be a liquid crystal display panel, an electronic paper, a mobile phone, a tablet computer, a television, a display, a notebook computer, a digital picture frame, a navigator and any other product or component having a display function.

The embodiment of the present disclosure further provides a manufacturing method of an organic electroluminescent diode, which comprises: forming a first electrode, a first electron blocking layer, a light-emitting layer and a second electrode, and a surface of the first electron blocking layer in contact with the light-emitting layer is doped with a hole-type non-metallic material; for example, the manufacturing method comprises: forming the first electrode, the first electron blocking layer, the light-emitting layer and the second electrode in sequence, or forming the second electrode, the light-emitting layer, the first electron blocking layer and the first electrode in sequence.

For example, in the manufacturing method provided by at least one embodiment of the present disclosure, the hole-type non-metallic material comprises at least one selected from a group consisting of 4,4',4''-tris(N-3-methylphenyl-N-phenylamino)-triphenylamine (m-MTADATA) and tris(2-phenylpyridine) Iridium ($Ir(ppy)_3$).

For example, the hole-type non-metallic material is uniformly doped in the first electron blocking layer.

For example, the hole-type non-metallic material is doped in a portion of the first electron blocking layer, and the portion of the first electron blocking layer doped with the hole-type non-metallic material is on a side of the first electron blocking layer close to the light-emitting layer.

For example, the manufacturing method further comprises: forming a hole transport layer between the first electrode and the first electron blocking layer; forming a hole injection layer between the first electrode and the hole transport layer, forming an electron transport layer between the light-emitting layer and the second electrode; and forming an electron injection layer between the electron transport layer and the second electrode.

For example, the manufacturing method provided by at least one embodiment of the present disclosure further comprises: forming a second electron blocking layer between the first electron blocking layer and the hole transport layer.

Figure 6:
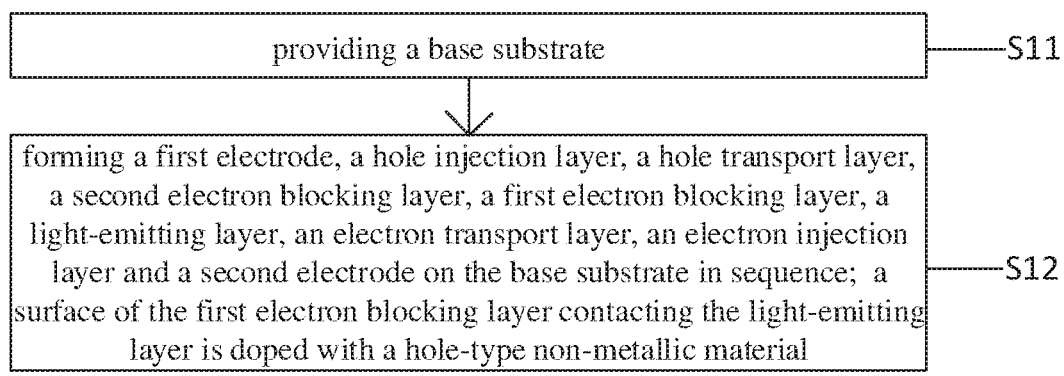
FIG. 6 is a flow chart of a manufacturing method of an organic light-emitting diode provided by an embodiment of the present disclosure.

For example, FIG. 6 is a flow chart of a manufacturing method of an organic light-emitting diode provided by an embodiment of the present disclosure. As illustrated in FIG. 6, the manufacturing method comprises the follows.

S11: providing a base substrate.

S12: forming a first electrode, a hole injection layer, a hole transport layer, a second electron blocking layer, a first electron blocking layer, a light-emitting layer, an electron transport layer, an electron injection layer and a second electrode on the base substrate in sequence, a surface of the first electron blocking layer contacting the light-emitting layer is doped with a hole-type non-metallic material.

For example, the step S12 can also be in the order of: forming the second electrode, the electron injection layer, the electron transport layer, the light-emitting layer, the first electron blocking layer, the second electron blocking layer, the hole transport layer, the hole injection layer and the first electrode in sequence, which are omitted herein.

For example, the hole-type non-metallic material comprises at least one selected from a group consisting of 4,4',4''-tris(N-3-methylphenyl-N-phenylamino)-triphenylamine (m-MTADATA) and tris(2-phenylpyridine) Iridium ($Ir(ppy)_3$).

For example, the hole-type non-metallic material is uniformly doped in the first electron blocking layer.

For example, the hole-type non-metallic material is doped in a portion of the first electron blocking layer, and the portion of the first electron blocking layer doped with the hole-type non-metallic material is on a side of the first electron blocking layer close to the light-emitting layer.

For example, all of the first electron blocking layer, the second electron blocking layer and the light-emitting layer are formed by an evaporation method.

The materials of the above layers can refer to the descriptions in the above embodiments, which are omitted herein.

For example, all of the hole injection layer, the hole transport layer, the first electron blocking layer, the second electron blocking layer, the light-emitting layer, the electron transport layer and the electron injection layer are formed by an evaporation method.

For example, the apparatus used in the embodiment of the present disclosure is: a high vacuum coating equipment (Shenyang Scientific Instrument Development Center Co., Ltd., pressure$<1\times10^{-3}$ pa).

For example, in the above embodiments, the first electron blocking layer and the light-emitting layer are formed by the evaporation process, such as a co-evaporation. For example, during the fabrication of the first electron blocking layer, the doping material and the host material in the first electron blocking layer are premixed first, and then an evaporation source is used to realize the co-evaporation. The co-evaporation of the light-emitting layer is similar to the co-evaporation of the first electron blocking layer, which are omitted herein. In addition to the first electron blocking layer and the light-emitting layer, other film layers in the organic light-emitting diode can also be formed by the co-evaporation method.

The structure and manufacturing method of the organic electroluminescent diode of the present disclosure will be described below in combination with specific embodiments. It can be understood by those skilled in the art that the following specific embodiments are only used to explain the concept of the present disclosure and are not intended to define the present disclosure.

First Example

Providing the base substrate; forming an indium tin oxide (ITO) layer on the base substrate, the ITO layer is used as the anode; and forming the hole injection layer (from 5 nm to 30 nm), the hole transport layer (from 1000 nm to 1300 nm), the first electron blocking layer (from 10 nm to 80 nm), the light-emitting layer (from the 20 nm to 40 nm), the electron transport layer (from 20 nm to 35 nm), the electron injection layer (from 1 nm to 3 nm), and a Mg—Ag alloy cathode in sequence.

The hole-type non-metallic material is m-MTADATA.

Second Example

Providing a base substrate; forming an indium tin oxide (ITO) layer on the base substrate, the ITO layer is used as the anode; and forming the hole injection layer (from 5 nm to 30 nm), the hole transport layer (from 1000 nm to 1300 nm), the second electron blocking layer (from 5 nm to 70 nm), the first electron blocking layer (from 5 nm to 10 nm), the light-emitting layer (from 20 nm to 40 nm), the electron transport layer (from 20 nm to 35 nm), the EIL layer (from 1 nm to 3 nm) and the Mg—Ag alloy cathode in sequence.

The hole-type non-metallic material is $Ir(ppy)_3$.

The embodiment of the present disclosure provides an organic electroluminescent diode, a display panel, a display device and a manufacturing method of the organic electroluminescent diode, which have at least one of the following beneficial effects:

(1) the organic electroluminescent diode provided by at least one embodiment of the present disclosure prolongs the lifetime of the organic electroluminescent diode by doping or partially doping a hole-type non-metallic material in the first electron blocking layer.

(2) the organic electroluminescent diode provided by at least one embodiment of the present disclosure increases the density of the holes at the recombination interface, increases the utilization rate of the holes and avoids the loss of the holes in the transmission process by doping or partially doping the hole-type non-metallic material in the first electron blocking layer.

(3) the organic electroluminescent diode provided by at least one embodiment of the present disclosure ensures that the holes are timely recombined with the transmitted electrons, and avoids the accumulation of too many electrons at the interface between the first electron blocking layer and the light-emitting layer, so as to reduce the damage to the first electron blocking layer.

The following points required to be explained:

(1) the drawings of the embodiments of the present disclosure only relate to the structures related to the embodiments of the present disclosure, and other structures can refer to the general design.

(2) for the sake of clarity, in the drawings used to describe the embodiments of the present disclosure, the thickness of layers or areas is enlarged or reduced, that is, the drawings are not drawn according to the actual scale. It is understood that in the case that an element such as a layer, membrane, region, or substrate is referred to as being "up" or "down" on another element, the element may be "directly" on "or" down "on another element or there may be intermediate elements.

(3) without conflict, the embodiments of the present disclosure and the features in the embodiments may be combined with each other to obtain new embodiments.

What are described above is related to only the illustrative embodiments of the present disclosure and not limitative to the protection scope of the present application. Any changes or substitutions that are easy for those skilled in the art to envisage are intended to be encompassed within the scope of the present disclosure. Therefore, the protection scope of the present application shall be defined by the accompanying claims.

What is claimed is:

1. An organic electroluminescent diode, comprising: a first electrode, a first electron blocking layer, a light-emitting layer and a second electrode which are stacked arranged in sequence, wherein only a surface of the first electron blocking layer in contact with the light-emitting layer is doped with a hole-type non-metallic material, and a surface of the first electron blocking layer away from the light-emitting layer is not doped with the hole-type non-metallic material.

2. The organic electroluminescent diode according to claim 1, wherein the hole-type non-metallic material comprises at least one selected from a group consisting of 4,4',4"-tris(N-3-methylphenyl-N-phenylamino)-triphenylamine (m-MTADATA) and tris(2-phenylpyridine) Iridium (Ir(ppy)$_3$).

3. The organic electroluminescent diode according to claim 1, wherein a mass percentage of the hole-type non-metallic material in the first electron blocking layer ranges from about 0.5% to 10%.

4. The organic electroluminescent diode according to claim 3, wherein the mass percentage of the hole-type non-metallic material in the first electron blocking layer ranges from about 1% to 5%.

5. The organic electroluminescent diode according to claim 1, wherein a host material of the first electron blocking layer comprises at least one selected from a group consisting of N,N'-bis(3-methylphenyl)-N,N'-diphenyl-4,4'-biphenyl-diamine, 4,4',4"-tris(carbazol-9-yl)triphenylamine and N,N'-(1-naphthyl)-N,N'-diphenyl-4,4'-biphenyldiamine.

6. The organic electroluminescent diode according to claim 1, further comprising a hole transport layer, wherein the first electron blocking layer is arranged between the light-emitting layer and the hole transport layer.

7. The organic electroluminescent diode according to claim 6, further comprising: a hole injection layer arranged between the first electrode and the hole transport layer; an electron transport layer arranged between the light-emitting layer and the second electrode; and an electron injection layer arranged between the electron transport layer and the second electrode.

8. The organic electroluminescent diode according to claim 6, further comprising: a second electron blocking layer arranged between the first electron blocking layer and the hole transport layer.

9. The organic electroluminescent diode according to claim 8, wherein a material of the second electron blocking layer is same as a host material of the first electron blocking layer.

10. A display panel, comprising the organic electroluminescent diode according to claim 1.

11. A display device, comprising the display panel according to claim 10.

12. A manufacturing method of an organic electroluminescent diode, comprising:
forming a first electrode, a first electron blocking layer, a light-emitting layer and a second electrode, wherein only a surface of the first electron blocking layer in contact with the light-emitting layer is doped with a hole-type non-metallic material, and a surface of the first electron blocking layer away from the light-emitting layer is not doped with the hole-type non-metallic material.

13. The manufacturing method according to claim 12, wherein the hole-type non-metallic material comprises at least one selected from a group consisting of 4,4',4"-tris(N-3-methylphenyl-N-phenylamino)-triphenylamine (m-MTADATA) and tris(2-phenylpyridine) Iridium (Ir(ppy)$_3$).

14. The manufacturing method according to claim 12, further comprising: forming a hole transport layer between the first electrode and the first electron blocking layer; forming a hole injection layer between the first electrode and the hole transport layer; forming an electron transport layer between the light-emitting layer and the second electrode; and forming an electron injection layer between the electron transport layer and the second electrode.

15. The manufacturing method according to claim 14, further comprising: forming a second electron blocking layer between the first electron blocking layer and the hole transport layer.

16. The manufacturing method according to claim 15, wherein all of the first electron blocking layer, the second electron blocking layer and the light-emitting layer are formed by an evaporation method.

* * * * *